United States Patent
Joos et al.

(10) Patent No.: US 10,164,529 B2
(45) Date of Patent: Dec. 25, 2018

(54) SPREAD SPECTRUM CLOCK GENERATOR AND METHOD

(71) Applicant: SEMICONDUCTOR COMPONENTS INDUSTRIES, LLC, Phoenix, AZ (US)

(72) Inventors: Dieter Jozef Joos, Nieuwenrode (BE); David Pierre Jean Robert Levacq, Brussels (BE); Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 239 days.

(21) Appl. No.: 15/245,467

(22) Filed: Aug. 24, 2016

(65) Prior Publication Data

US 2017/0353108 A1    Dec. 7, 2017

Related U.S. Application Data

(60) Provisional application No. 62/219,521, filed on Sep. 16, 2015.

(51) Int. Cl.
*H02M 1/44* (2007.01)
*H03K 3/0231* (2006.01)
(Continued)

(52) U.S. Cl.
CPC .............. *H02M 3/158* (2013.01); *H02M 1/44* (2013.01); *H02M 3/157* (2013.01); *H03B 5/20* (2013.01);
(Continued)

(58) Field of Classification Search
CPC ........ H02M 1/44; H02M 1/12; H03K 3/0231; H03C 3/00; H03C 3/02; H04B 1/69;
(Continued)

(56) References Cited

U.S. PATENT DOCUMENTS

| 4,638,417 A | 1/1987 | Martin, Jr. et al. |
| 5,488,627 A | 1/1996 | Hardin et al. |

(Continued)

OTHER PUBLICATIONS

D.B.Yen Nguyen, J.A. Cartwright, Young-Hun Ko, Sang-Gug Lee, and D.S.HA; "A high-precision spread spectrum clock generator based on a fractional-N phase locked loop"; U-Radio Lab; Korean Advanced Institute of Science Technology and VTVT Lab; Virginia Tech Analog Integrated Circuits and Signal Processing; Jan. 2013, 5 pages.

(Continued)

*Primary Examiner* — Ryan Johnson
(74) *Attorney, Agent, or Firm* — Polansky & Associates, P.L.L.C.; Paul J. Polansky

(57) ABSTRACT

In one form, a spread spectrum clock generator includes an oscillator and a digital modulator. The oscillator has a control input for setting an output frequency, and an output for providing a clock output signal. The digital modulator is responsive to the clock output signal to provide a control code to the control input of the oscillator as a periodic signal with a plurality of discrete steps, wherein the digital modulator provides said control code at each of said plurality of discrete steps for substantially a predetermined time.

28 Claims, 6 Drawing Sheets

(51) Int. Cl.
  *H02M 3/158* (2006.01)
  *H03B 23/00* (2006.01)
  *H04B 1/69* (2011.01)
  *H02M 3/157* (2006.01)
  *H03B 5/20* (2006.01)
  *H04B 15/06* (2006.01)

(52) U.S. Cl.
  CPC ........... *H03B 23/00* (2013.01); *H03K 3/0231* (2013.01); *H04B 1/69* (2013.01); *H04B 15/06* (2013.01); *H04B 2215/067* (2013.01)

(58) Field of Classification Search
  CPC .. H04B 15/04; H04B 15/02; H04B 2215/067; H03B 23/00; G06F 1/08
  See application file for complete search history.

(56) References Cited

U.S. PATENT DOCUMENTS

| | | | |
|---|---|---|---|
| 6,008,703 A | 12/1999 | Perrott et al. | |
| 6,249,876 B1 | 6/2001 | Balakrishnan et al. | |
| 6,442,188 B1 | 8/2002 | Zhang et al. | |
| 6,980,039 B1 * | 12/2005 | Dening | H02M 1/12 327/164 |
| 8,981,858 B1 * | 3/2015 | Wright | H03K 3/84 331/111 |
| 9,479,113 B2 * | 10/2016 | Yamamoto | H03B 5/26 |
| 2003/0039330 A1 | 2/2003 | Castiglione et al. | |
| 2004/0183602 A1 | 9/2004 | Maunuksela et al. | |
| 2005/0008113 A1 | 1/2005 | Kokubo et al. | |
| 2005/0129142 A1 | 6/2005 | Yellin et al. | |
| 2005/0151595 A1 | 7/2005 | Pratt et al. | |
| 2006/0056561 A1 | 3/2006 | Zhang | |
| 2006/0088126 A1 | 4/2006 | Puma | |
| 2007/0176705 A1 | 8/2007 | Sutardja | |
| 2008/0042766 A1 | 2/2008 | Tarng | |
| 2008/0063130 A1 | 3/2008 | Chen | |
| 2011/0163815 A1 | 7/2011 | Bellaouar | |
| 2012/0105114 A1 | 5/2012 | Yun et al. | |
| 2012/0112809 A1 | 5/2012 | Zhu et al. | |

OTHER PUBLICATIONS

Kokubo, M. et al; "Spread-Spectrum Clock Generator for Serial ATA using Fractional PLL Controlled by ΔΣ Modulator with Level Shifter"; 2005 IEEE International Solid-State Circuits Conference; Feb. 8, 2005; pp. 160-161 & p. 590.

Ebuchi, T. et al.; "A 125-1250 MHz Process-Independent Adaptive Bandwidth Spread Spectrum Clock Generator with Digital Controlled Self-Calibration"; IEEE Journal of Solid-State Circuits; vol. 44, No. 3; Mar. 2009; pp. 763-774.

Power Electronics Technology; Conforming with Worldwide Safety and EMC/EMI Standards; Nov. 2010; pp. 24-27.

Kim, C.et al.; "A Cost-Effective Design of Spread Spectrum Clock Generator"; 2010 IEEE International Conference on Solid-State and Integrated Circuit Technology; Nov. 2010; 4 pages.

Stone, D et al.; "Random Carrier Frequency Modulation of PEM Waveforms to Ease EMC Problems in Switched Mode Power Supplies"; 1995 International Conference on Power Electronics and Drive Systems; Feb. 1995; pp. 16-21.

See Taur Lee, Sher Jiun Fang, David J. Allstot, Abdellatif Bellaouar, Ahmed R. Fridi and Paul A. Fontaine; "A Quad-Band GSM-GPRS Transmitter With Digital Auto-Calibration"; University of Washington and Texas Instruments; Dec. 2004; IEEE; 15 pages.

* cited by examiner

SPREAD SPECTRUM CLOCK GENERATOR AND METHOD

CROSS-REFERENCE TO RELATED APPLICATION(S)

This application claims priority to U.S. Provisional Application No. 62/219,521, filed Sep. 16, 2015, entitled "Spread Spectrum Clock Generator by Digital Controlled FM Modulation (FHSS)," and invented by Dieter Joos and David Levacq.

Related subject matter is found in the following co-pending applications: application Ser. No. 14/864,135, filed Sep. 24, 2015, entitled "Calibration for Spread Spectrum Clock Generator and Method," invented by Toru Dan and assigned to the assignee hereof; and application Ser. No. 14/864,060, filed Sep. 24, 2015, entitled "Spread Spectrum Clock Generator and Method," invented by Toru Dan and assigned to the assignee hereof.

FIELD OF THE DISCLOSURE

The present disclosure relates generally to clock generator circuits, and more particularly to spread spectrum clock generator circuits.

BACKGROUND

Some electronic components are susceptible to faulty operation in the presence of high levels of electromagnetic interference (EMI). EMI is any unwanted signal transmitted by electromagnetic induction or electromagnetic radiation that affects an electrical circuit. There are many potential sources of EMI such as digital clock signals in microprocessors and microcontrollers, periodic signals used in switched mode power supplies, local oscillator signals used in radio circuits to tune radio frequency (RF) signals, periodic noise from induction motors, and the like.

Several different standards bodies in different jurisdictions around the world define acceptable levels of generated EMI for a certified product. In order to reduce EMI below these standardized levels, circuit designers have sometimes used spread spectrum clock signals. Instead of having a constant frequency, spread spectrum clock signals have frequencies that vary over a certain range to reduce the radiated energy at any given frequency to below the standardized level. In order to efficiently implement spread spectrum, it is desirable to spread the energy of the clock signal as uniformly as possible over the desired range. One known technique to spread the spectrum over the desired range is to vary the frequency of the clock signal using a lower frequency triangular wave signal. While spreading the clock frequency using a triangular wave signal theoretically yields a perfectly uniform frequency spectrum, it becomes less than perfect when implemented using practical circuits and to improve the spreading, known techniques are often expensive in terms of circuit area and cost.

BRIEF DESCRIPTION OF THE DRAWINGS

In the following description, the use of the same reference numerals in different drawings indicates similar or identical items.

Figure 1:
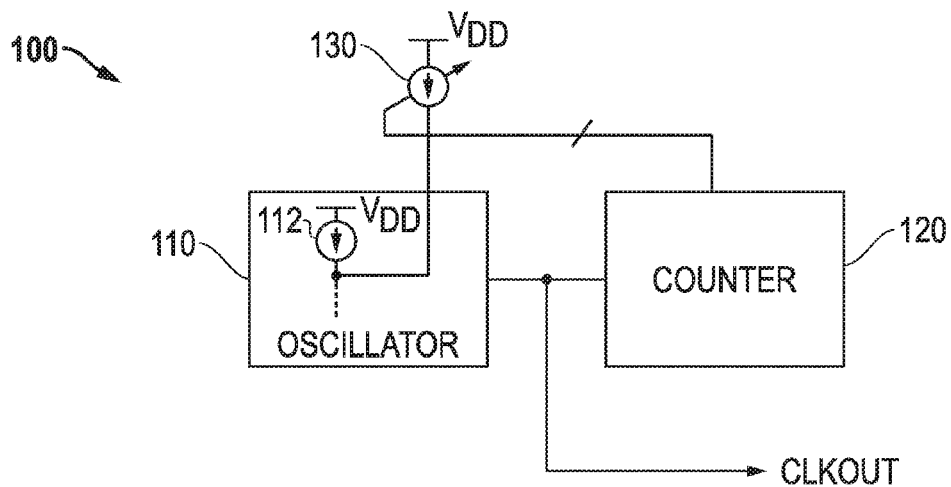
FIG. 1 illustrates in partial block diagram and partial schematic form a spread spectrum clock generator known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

FIG. 1 illustrates in partial block diagram and partial schematic form a spread spectrum clock generator 100 known in the prior art. Spread spectrum clock generator 100 includes generally an oscillator 110, a counter 120, and a current source 130. Oscillator 110 has a control input, and an output for providing a clock output signal labeled "CLKOUT". Oscillator 110 includes a current source 112 having a first terminal connected to a power supply voltage terminal labeled "$V_{DD}$", and a second terminal connected to the control input of oscillator 110. Counter 120 has an input connected to the output of oscillator 110, and an output. Current source 110 has a first terminal connected to $V_{DD}$, a second terminal connected to the control input of oscillator 110, and a control input connected to the output of counter 120.

Spread spectrum clock generator 100 uses oscillator 110 to generate the CLKOUT signal, but has a control input that allows for spreading the frequency of the CLKOUT signal over a range to reduce peak EMI. Oscillator 110 includes a relaxation oscillator that charges a capacitor (not shown in FIG. 1) using the combination of a fixed current source 112 and a variable current source 130. By making the current provided by variable current source 130 a fraction of the current provided by current source 112, spread spectrum clock generator 100 provides the CLKOUT signal at a frequency that varies over a range that is small compared to the frequency of the CLKOUT signal. Counter 120 counts clocks of oscillator 110 to provide a digital ramp signal to current source 130. Thus counter 120 sweeps the current of current source 130, and thus the frequency of oscillator 110, over a range in which the frequency increases until counter 120 reaches its maximum count, and then returns to its starting count.

Spread spectrum clock generator 100, however, does not spread EMI ideally over the desired range because counter 120 counts in response to the output of oscillator 110 itself. When oscillator 110 is oscillating faster due to the current added by current source 130, counter 120 counts faster and when oscillator 110 is oscillating slower due to the current added by current source 130, counter 120 counts slower. Thus spread spectrum clock generator 100 spends more time on the lower end of the frequency range and has higher EMI at the low end of the frequency range. Since EMI is measured as the highest EMI over the desired frequency range, spread spectrum clock generator 100 is not as efficient in spreading EMI as it could be.

Figure 2:
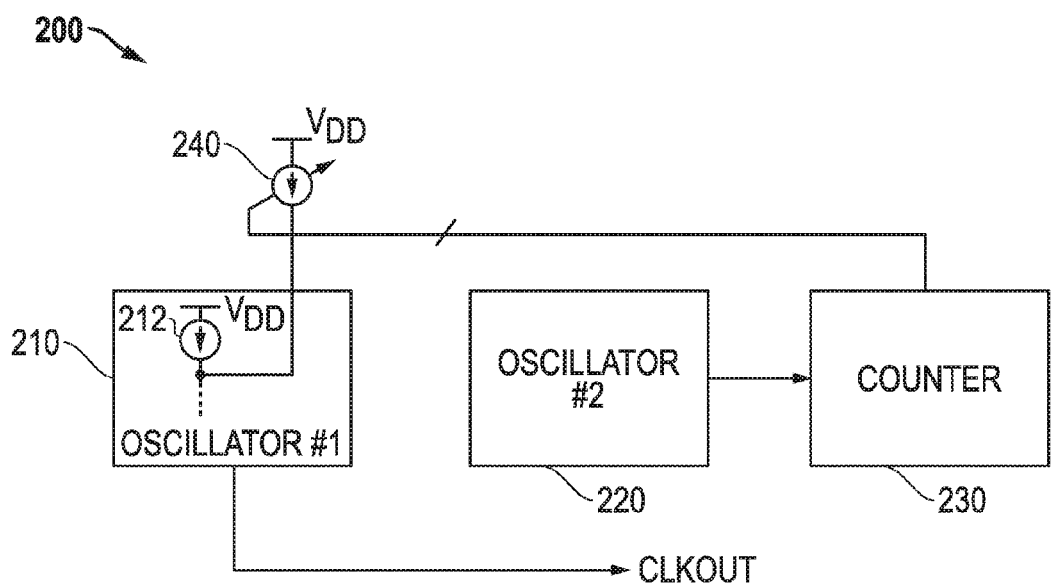
FIG. 2 illustrates in partial block diagram and partial schematic form another spread spectrum clock generator known in the prior art.

FIG. 2 illustrates in partial block diagram and partial schematic form another spread spectrum clock generator 200 known in the prior art. Spread spectrum clock generator 200 includes generally an oscillator 210 labeled "OSCILLATOR #1", an oscillator 220 labeled "OSCILLATOR #2", a counter 230, and a current source 240. Oscillator 210 has a control input, and an output for providing the CLKOUT signal. Oscillator 210 includes a current source 212 having a first terminal connected to $V_{DD}$, and a second terminal connected to the control input of oscillator 210. Oscillator 220 has an output for providing another clock signal. Counter 230 has an input connected to the output of oscillator 220, and an output. Current source 240 has a first terminal connected to $V_{DD}$, a second terminal connected to the control input of oscillator 210, and a control input connected to the output of counter 230.

Spread spectrum clock generator 200 operates similarly to spread spectrum clock generator 100 of FIG. 1, except that it uses a second oscillator 220 to generate a signal for clocking counter 230. Because counter 230 is connected to a separate oscillator, its input clock is not affected by the spreading and the sweep provided by current source 240 is uniform. However spread spectrum clock generator 200 requires an additional oscillator, which increases circuit area and cost as well as power consumption.

Counter 230 can be implemented by a ramp counter, but in order to reduce the abrupt change in frequency that would otherwise occur when the frequency of counter 230 is reduced from the high end of the range to the low end of the range, spread spectrum clock generator 200 can further include an intervening circuit that causes the direction of counting to reverse when counter 230 reaches its peak value. However this digital ramp waveform introduces some EMI peaking at the high and low ends of the range of frequencies, limiting the EMI reduction over the range. In order to overcome this distortion in the frequency characteristic and make the spread spectrum EMI reduction more uniform, another known design compensates for this problem.

Figure 3:
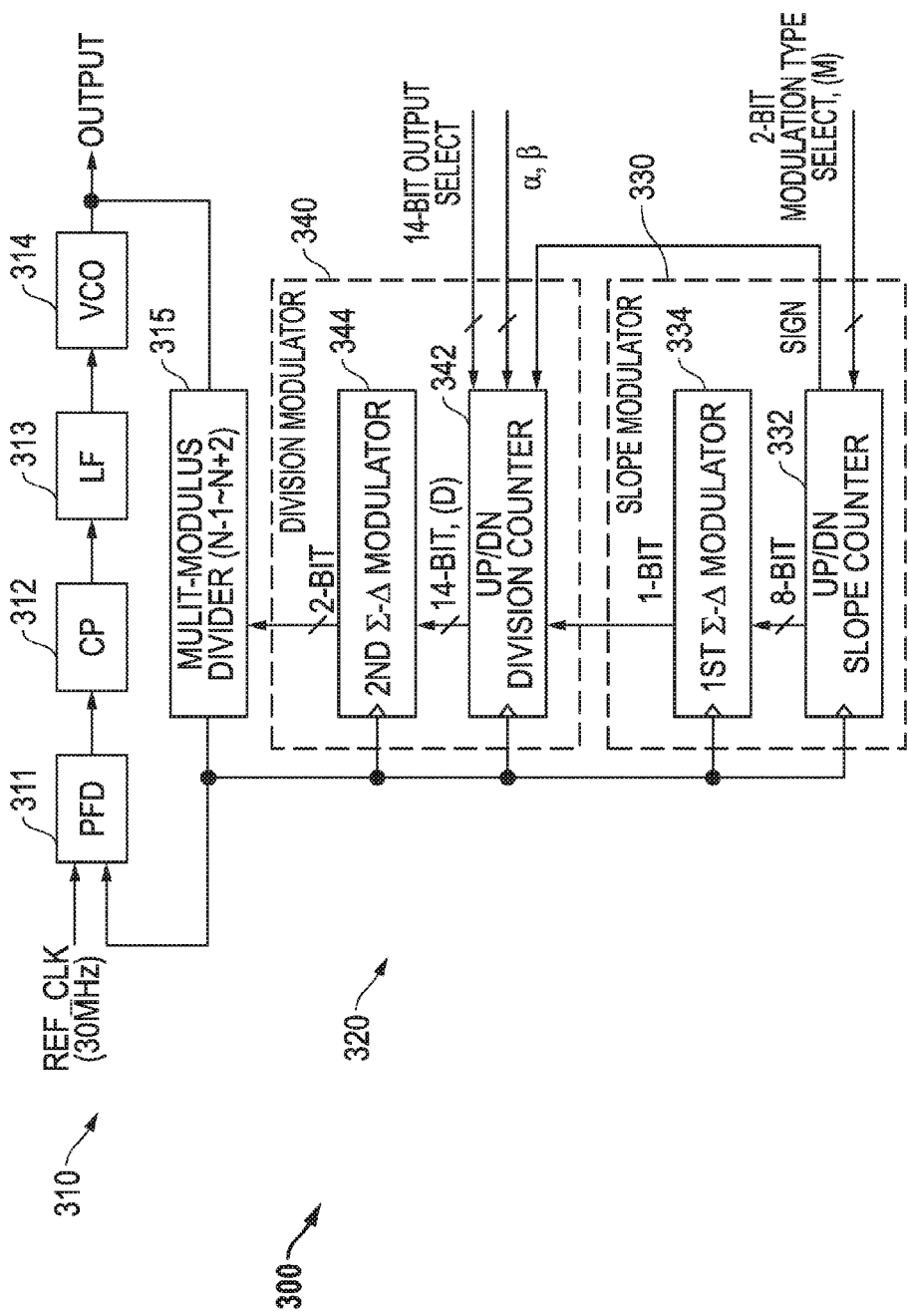
FIG. 3 illustrates in block diagram form yet another spread spectrum clock generator known in the prior art.

FIG. 3 illustrates in block diagram form yet another spread spectrum clock generator 300 known in the prior art. Spread spectrum clock generator 300 includes generally a phase locked loop 310, and a signal generator 320. Phase locked loop 310 includes a phase and frequency detector 311 labeled "PFD", a charge pump 312 labeled "CP", a loop filter 313 labeled "LF", a voltage controlled oscillator (VCO) 314, and a multi-modulus divider 315. Phase and frequency detector 311 has a reference clock input for receiving a reference clock signal labeled "REF_CLK", a loop clock input, and an output. Charge pump 312 has an input connected to the output of phase and frequency detector 311, and an output. Loop filter 313 has an input connected to the output of charge pump 312, and an output. VCO 314 has an input connected to the output of loop filter 313, and an output for providing an output clock signal labeled "OUTPUT". Multi-modulus divider 315 has a signal input connected the output of VCO 314, a control input, and an output connected to the loop clock input of phase and frequency detector 311.

Signal generator 320 includes generally a slope modulator 330 and a division modulator 340. Slope modulator 330 includes an up/down slope counter 332 and a sigma-delta (ΣΔ) modulator 334. Slope counter 332 has a modulation select control input for receiving a 2-bit modulation type select signal, a clock input connected to the output of multi-modulus divider 315, an 8-bit count output, and a sign bit output labeled "SIGN". ΣΔ modulator 334 has a signal input connected to the count output of slope counter 332, a clock input connected to the output of multi-modulus divider 315, and an output for providing a single bit output signal. Division modulator 340 includes an up/down division counter 342 and a sigma-delta (ΣΔ) modulator 344. Division counter 342 has a signal input connected to the output of ΣΔ modulator 334, a clock input connected to the output of multi-modulus divider 315, a control input for receiving the sign output of slope counter 332, a waveform shape input for receiving parameters labeled "α" and "β", an output select input for receiving a 14-bit output select signal, and a 14-bit count output. ΣΔ modulator 344 has a signal input connected to the count output of division counter 342, a clock input connected to the output of multi-modulus divider 315, and an output connected to the control input of multi-modulus divider 315.

Spread spectrum clock generator 300 is used to create a modulation profile that overcomes the peaking at the high and low frequencies caused by using a triangular waveform. Spread spectrum clock generator 300 uses a modified triangular waveform as disclosed in U.S. Pat. No. 5,488,627. This waveform is in the shape of a triangular wave and its cubic, and has a similar shape to the chocolate candy sold under the trademark "Hershey's Kiss" sold by the Hershey Company of Hershey, Pa. Thus the waveform exhibits characteristics somewhat opposite those of a triangular waveform near its high and low voltages.

In the frequency domain, spread spectrum clock generator 300 has an EMI spectrum that peaks but is flat throughout the middle of the desired frequency range, but exhibits variable attenuation at the edges of the band. In addition, it does not exhibit peaking at the sidebands and thus is more efficient in limiting EMI over the desired frequency range.

However spread spectrum clock generator 300 is complex and requires a large circuit area and cost and relatively high power consumption. PLL 310 is significantly more complex than a simple relaxation oscillator, requiring a digital phase and frequency detector 311, a charge pump 312, a voltage controlled oscillator 314, and a multi-modulus divider 315. In addition, slope modulator 330 and division modulator 340 are used to create the "Hershey's Kiss" waveform. It would be desirable to have the benefits of the relatively-flat EMI spectrum provided by spread spectrum clock generator 300 but without the complexity that results in increased circuit area and cost. Such a clock generator will now be described.

Figure 4:
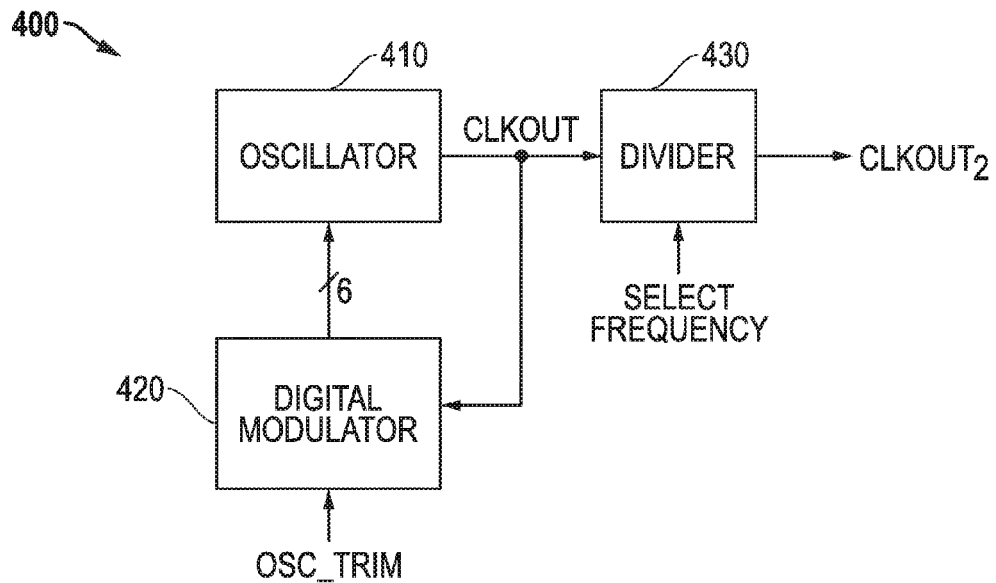
FIG. 4 illustrates in block diagram form a spread spectrum clock generator according to an embodiment of the present invention.

FIG. 4 illustrates in block diagram form a spread spectrum clock generator 400 according to an embodiment of the present invention. Spread spectrum clock generator includes an oscillator 410, a digital modulator 420, and a divider 430. Oscillator 410 has a control input for setting an output frequency, and an output for providing the CLKOUT signal. Digital modulator 420 has an input connected to the output of oscillator 410, a trim input for receiving an oscillator trim signal labeled "OSC_TRIM", and an output for providing a 6-bit control code to the control input of oscillator 410. Divider 430 has a clock input connected to the output of oscillator 410, a control input for receiving a control signal labeled "SELECT FREQUENCY", and an output for providing a clock signal labeled "CLKOUT2".

Oscillator 410 has a nominal base frequency but varies the base frequency according to the 6-bit control code received from digital modulator 420. As will be shown, oscillator 410 can be implemented as a simple relaxation oscillator rather than a complex phase locked loop.

Digital modulator 420 receives the CLKOUT signal from the output of oscillator 410 and uses it to clock its internal operations. However digital modulator 420 does not divide the CLKOUT signal and use the divided CLKOUT signal to change the frequency over the desired spreading range like spread spectrum clock generator 100 of FIG. 1. Rather it provides the 6-bit control code to sequence through a set of offset values to the nominal value of the CLKOUT signal, and alters the number of cycles that it uses to provide the control code in a given state to ensure it provides each unique value of the digital code for substantially a predetermined time. As used herein, digital modulator 420 provides each unique value for substantially a predetermined time by counting a number of cycles of the CLKOUT signal corresponding to its phase such that the elapsed time is approximately equal to same time for each phase. A digital modulator circuit that provides this function with a small circuit area will be described below.

Divider 430 is an output divider used to provide CLK-OUT2 at a variety of output frequencies useful for the application circuit to which spread spectrum clock generator 400 is connected. It divides the CLKOUT signal by a divider value indicated, directly or indirectly, by the SELECT FREQUENCY signal. In turn the SELECT FREQUENCY signal may be formed in a variety of ways, such as by programmable fuses at factory test, by receiving an input value at startup, by the value of an external resistor, etc. For example if the CLKOUT signal has a frequency is 8.4 megahertz (MHz), and the SELECT FREQUENCY indicates a divider of 14, then the CLKOUT2 signal is 600 kHz, whereas if SELECT FREQEUNCY indicates a divider of 42, then the CLKOUT2 signal is 200 kHz.

As will be seen, spread spectrum clock generator 400 provides highly efficient EMI spreading over the desired range, but without significant circuit complexity and with the use of only a single oscillator, which itself is relatively simple.

Figure 5:
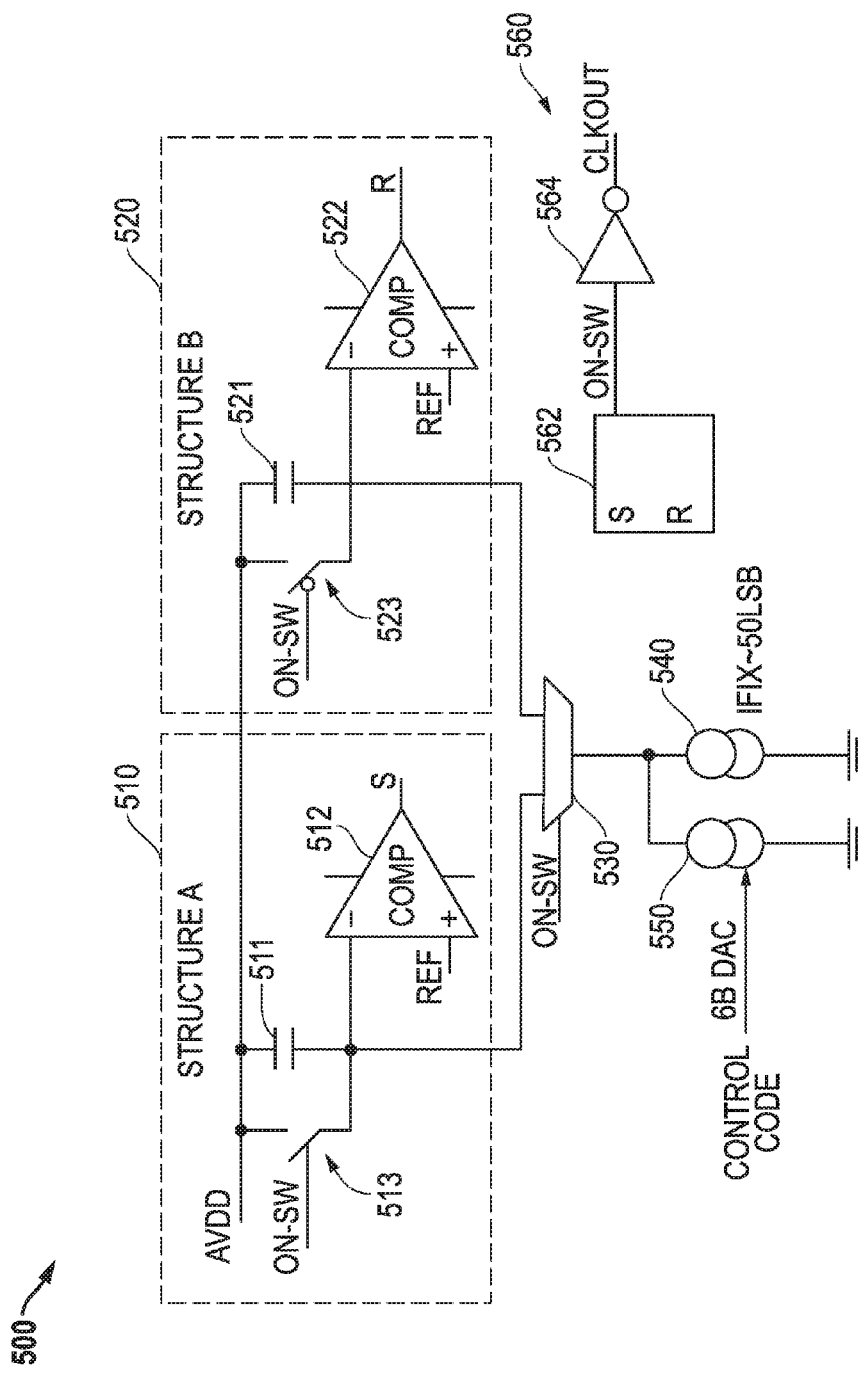
FIG. 5 illustrates in partial block diagram and partial schematic form a relaxation oscillator suitable for us as the oscillator of FIG. 4.

FIG. 5 illustrates in partial block diagram and partial schematic form a relaxation oscillator 500 suitable for use as oscillator 410 of FIG. 4. Relaxation oscillator 500 includes generally two circuit structures 510 and 520 labeled "STRUCTURE A" and "STRUCTURE B" that are used to define the high time and the low time, respectively, of the CLKOUT signal, a demultiplexer 530, a fixed current source 540, a digitally controlled current source 550, and a control circuit 560.

Circuit structure 510 includes a capacitor 511, a comparator 512, and a switch 513. Capacitor 511 has a first terminal connected to a positive power supply voltage terminal labeled "AVDD", and a second terminal. AVDD is a supply voltage high enough for the proper operation of analog circuitry and will typically be higher than the power supply voltage for the digital circuitry. Comparator 512 has an inverting input connected to the second terminal of capacitor 511, a non-inverting input terminal for receiving a reference voltage labeled "REF", and an output terminal for providing a set signal labeled "S". Switch 513 has a first terminal connected to AVDD, a second terminal connected to the second terminal of capacitor 511, and a true control terminal for receiving a signal labeled "ON-SW".

Circuit structure 520 includes a capacitor 521, a comparator 522, and a switch 523. Capacitor 521 has a first terminal connected to AVDD, and a second terminal. Comparator 522 has an inverting input connected to the second terminal of capacitor 521, a non-inverting input terminal for receiving reference voltage REF, and an output terminal for providing a reset signal labeled "R". Switch 523 has a first terminal connected to AVDD, a second terminal connected to the second terminal of capacitor 521, and a complementary control terminal for receiving signal ON-SW.

Demultiplexer 530 has an input terminal, a first output terminal connected to the second terminal of capacitor 511, a second output terminal connected to the second terminal of capacitor 521, and a select input for receiving signal ON-SW. Fixed current source 540 has a first terminal connected to the input terminal of demultiplexer 530, and a second terminal connected to ground. Digitally controlled current source 550 has a first terminal connected to the input terminal of demultiplexer 530, a second terminal connected to ground, and a control terminal for receiving the 6-bit CONTROL CODE from digital modulator 420.

Control circuit 560 includes a set-reset (SR) flip-flop 562, and an inverter 564. SR flip-flop 562 has an S input connected to the output of comparator 512, a reset input connected to the output of comparator 522, and an output for providing the ON-SW signal. Inverter 564 has an input connected to the output of SR flip-flop 562, and an output for providing the CLKOUT signal.

Relaxation oscillator 500 uses two similar circuits, STRUCTURE A and STRUCTURE B, to determine the ramp up and the ramp down time of a triangle wave. Capacitors 511 and 521 are matched to provide uniform rise and fall time and a duty cycle of the CLKOUT signal of about 50%. During one phase when ON-SW is high, switch 513 is closed to set the voltage at the second terminal of capacitor 511 equal to AVDD. Switch 523 is open, and demultiplexer 530 selects the second output. The rate at which capacitor 521 charges determines the low time of the CLKOUT signal, and this rate is set by the current set by the combination of fixed current source 54 and variable current source 550. Current source 550 operates as a digital-to-analog converter that transforms the binary CONTROL CODE into a corresponding current using, for example, switched binarily weighted current sources.

During the other phase when ON-SW is low, switch 523 is closed to set the voltage at the second terminal of capacitor 521 equal to AVDD. Switch 513 is open, and demultiplexer 530 selects the first output. The rate at which capacitor 511 charges determines the high time of the CLKOUT signal, and this rate is set by the current set by the combination of fixed current source 54 and variable current source 550.

In other embodiments, any of a number of well known relaxation oscillators can be used, including a relaxation oscillator that uses the same current source to control both charging and discharging of a single capacitor.

Figure 6:
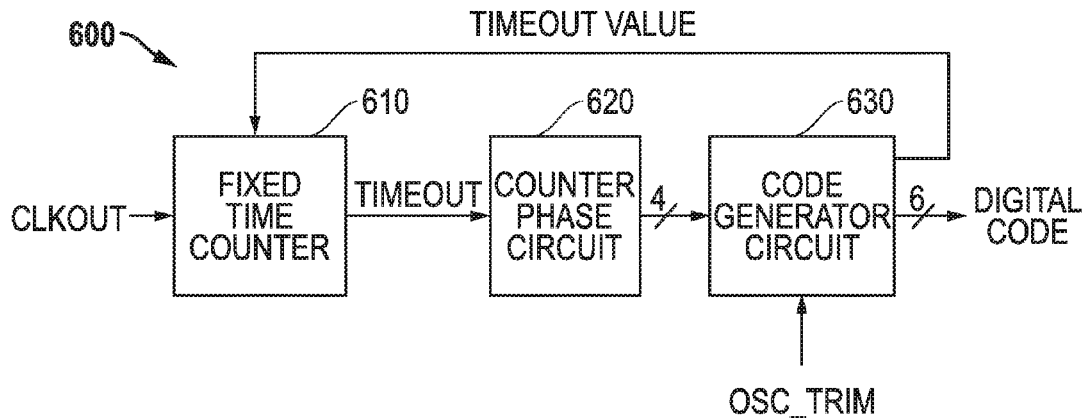
FIG. 6 illustrates in block diagram form a digital modulator suitable for use as the digital modulator of FIG. 4.

FIG. 6 illustrates in block diagram form a digital modulator 600 suitable for use as digital modulator 420 of FIG. 4. Digital modulator 600 includes generally a fixed time counter 610, a counter phase circuit 620, and a code generator circuit 630. Fixed time counter 610 has a clock input for receiving the CLKOUT signal, a control input for receiving a timeout value labeled "TIMEOUT VALUE", and an output for providing a signal labeled "TIMEOUT". Counter phase circuit 620 has an input connected to the output of fixed time counter 610, and an output for providing a 4-bit counter phase value. Code generator circuit 630 has a first input connected to the output of counter phase circuit 620, a second input for receiving the OSC_TRIM signal, a first output for providing the TIMEOUT VALUE, and a second output connected to the control input of the oscillator for providing a 6-bit DIGITAL CODE.

Fixed time counter 610 provides the TIMEOUT signal after it counts approximately a predetermined time, which is a time close to the predetermined time but is not exactly so because it is limited by the frequency of the CLKOUT signal. Code generator circuit 630 adjusts the TIMEOUT VALUE in response to the counter phase, which corresponds to a different frequency of the CLKOUT signal. If oscillator 410 is relatively slow because of the spread spectrum frequency modulation, then fixed time counter 610 times out after a fewer number of cycles. Conversely, if oscillator 410 is relatively fast because of the spread spectrum frequency modulation, then fixed time counter 610 times out after a greater number of cycles. Fixed time counter 610 activates the TIMEOUT signal to represent the completion of one discrete step of the digital spread spectrum modulation after the predetermined time.

Counter phase circuit 620 is a simple state machine that cycles through a series of states corresponding to different discrete steps of the CLKOUT signal. In the illustrated embodiment, counter phase circuit 620 is itself a binary counter that has sixteen states and provides a 4-bit output signal to lookup table 630.

In one form, code generator circuit 630 is implemented using a lookup table that uses the counter phase encoded on the 4-bit output of counter phase circuit 620 to index into a set of stored values in lookup table 630. Each of the stored values includes a pair of values, one for the TIMEOUT VALUE and another for the DIGITAL CODE corresponding to the counter phase. When the base frequency of oscillator 410 and the EMI spreading requirements are known, lookup table 630 can be implemented as a small read-only memory (ROM), which is very efficient in terms of circuit area. In another embodiment in which spread spectrum clock generator 400 is used in an integrated circuit that can be programmed for different environments with different clock frequencies, lookup table 630 can be implemented as a one-time programmable ROM to allow the characteristics to be programmed.

In another form, code generator circuit 630 is implemented using a digital finite state machine. In this embodiment, the TIMEOUT VALUE can be calculated as a linear combination of the DIGITAL CODE and the OSC_TRIM signal.

Another aspect of digital modulator 600 is that code generator circuit 630 receives the OSC_TRIM signal to allow the base frequency of oscillator 410 to be calibrated after the integrated circuit is manufactured to compensate for processing variations. In one embodiment, code generator circuit 630 adds an offset value indicated by the OSC_TRIM signal to the DIGITAL CODE that will allow the base frequency of oscillator 420 to be offset by a small percentage of the desired frequency of the CLKOUT signal that compensates for foreseeable manufacturing variations. In this case, a small adder circuit having six or fewer bits can be used.

In one embodiment, counter phase circuit 620 also receives the OSC_TRIM signal, and uses the OSC_TRIM signal to vary the number of states it cycles through to keep the modulation depth of spread spectrum clock generator 600 substantially fixed, despite processing variations. If the OSC_TRIM signal is smaller, then counter phase circuit 620 employs a smaller digital amplitude of the counter phase (a fewer number of discrete steps). Conversely, if the OSC_TRIM signal is larger, then counter phase circuit 620 employs a larger digital amplitude of the counter phase (a greater number of discrete steps).

Figure 7:
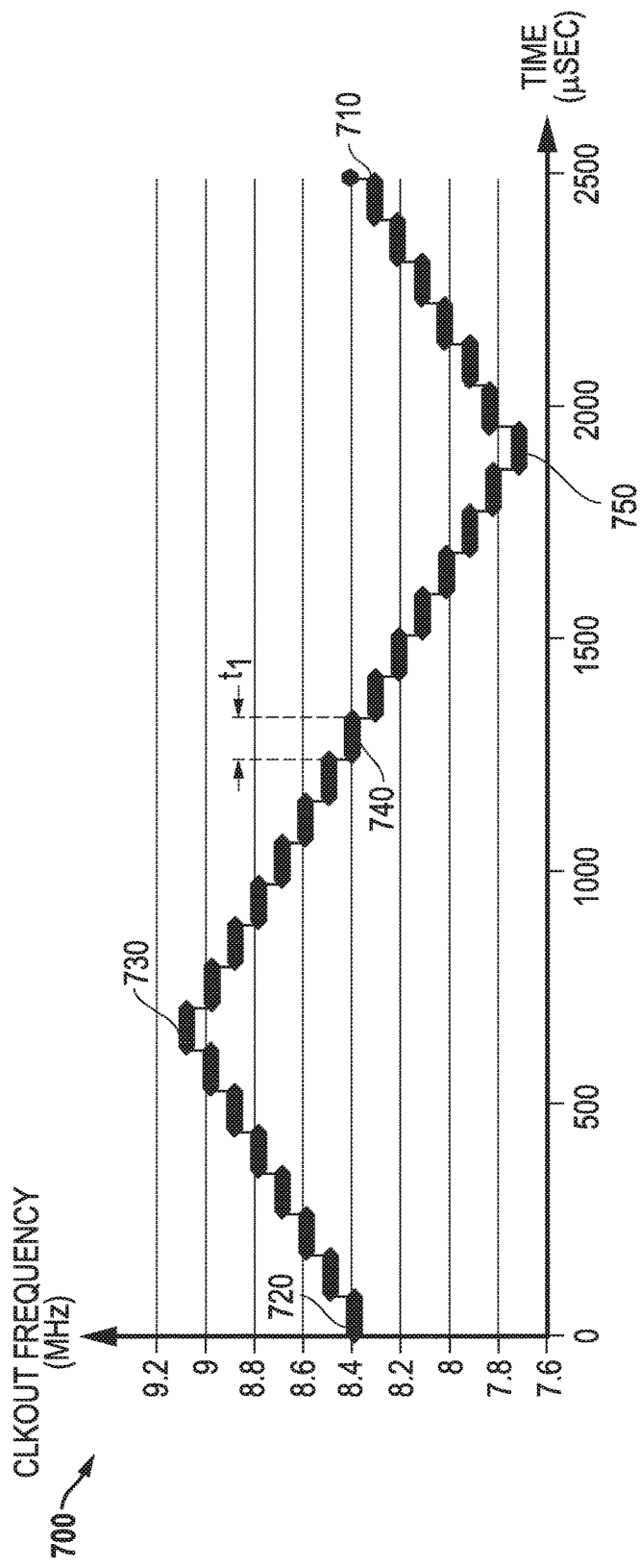
FIG. 7 illustrates a timing diagram showing the operation of the spread spectrum clock generator of FIG. 4.

FIG. 7 illustrates a timing diagram 700 showing the operation of spread spectrum clock generator 400 of FIG. 4. In FIG. 7, the horizontal axis represents time in microseconds (pec), and the vertical axis represents the frequency of CLKOUT in megahertz (MHz). In this example, the nominal base frequency of CLKOUT is 8.4 MHz, but due to the spreading action of spread spectrum clock generator 400, the frequency varies between about 7.728 MHz and about 9.072 MHz, or about ±8% (referred to as a modulation depth of 8%). Timing diagram 700 shows one complete cycle of a triangle wave 710 implemented using 15 discrete steps. As shown waveform 710 starts at 0 μsec at a middle level 720 corresponding to the base frequency of 8.4 MHz, and ramps up to a largest frequency step 730 of 9.072 MHz in 7 discrete steps, then ramps down to a smallest frequency 750 of 7.728 MHz in 14 discrete steps, and then returns to the nominal base frequency of 8.4 MHz in 7 discrete steps. The complete frequency modulation cycle spans 2500 μsec to provide 400 Hz modulation. The ramp from the largest frequency to the smallest frequency takes place in 14 steps, and the ramp from the smallest back to the largest takes place in 14 steps, and thus one complete cycle has 28 discrete steps. Each step lasts for 2500 μsec/28=89.29 μsec, shown as a time labeled "$t_1$".

Digital modulator 600 can accurately implement this system as follows. Lookup table 640 provides the TIMEOUT VALUE as a count of the number of cycles of oscillator 410 at the frequency of the current oscillator phase that would approximate 89.29 μsec. It does so using an even divider to simplify the logic. The values required for each counter phase are shown in TABLE I below:

TABLE I

| Counter phase | TIMEOUT (ideal) | TIMEOUT VALUE | $t_{STEP}$ (μsec) |
|---|---|---|---|
| +7 | 810.00 | 806 | 88.3 |
| +6 | 801.43 | 798 | 88.5 |
| +5 | 792.86 | 790 | 88.8 |
| +4 | 784.29 | 782 | 88.8 |
| +3 | 775.71 | 774 | 89.0 |
| +2 | 767.14 | 766 | 89.1 |
| +1 | 758.17 | 758 | 89.2 |
| 0 | 750.00 | 750 | 89.3 |
| −1 | 741.43 | 742 | 89.3 |
| −2 | 732/86 | 734 | 89.4 |
| −3 | 724.29 | 726 | 89.4 |
| −4 | 715.71 | 718 | 89.4 |
| −5 | 707.14 | 710 | 89.4 |
| −6 | 698.57 | 702 | 89.3 |
| −7 | 690.00 | 694 | 89.2 |

The total of the step times is equal to 2495 μsec, which corresponds to 400.8 Hz, and thus is very close to the desired modulation frequency. In this example digital modulator 600 counts in each phase for substantially the predetermined time by counting a corresponding number of cycles that yields a time that is close to the ideal time of 89.29 μsec within practical limits. For example digital modulator 600 restricts the divide ratios to even numbers of clock cycles to simplify the design of fixed time counter 610. Moreover the average amount of time in each phase is 89.11 μsec, which is very close to the desired time.

In the frequency domain, digital modulator 600 produces an EMI spectrum that has a large number of closely spaced discrete tones that define the EMI level. In another embodiment, digital modulator 600 could dither between adjacent pairs of discrete frequency steps to provide a more uniform EMI spectrum, but at the expense of increasing circuit complexity and size.

Digital modulator 600 is very small in terms of circuit area because it uses only compact digital circuitry. A practical implementation of fixed time counter 610 to implement these divide ratios requires only about 1,000 logic gates, which allows fixed time counter 610 to be relatively small using modern CMOS integrated circuit technology. Along with the re-use of oscillator 410, spread spectrum clock generator 400 avoids spreading the EMI more heavily to lower frequencies using known single-oscillator designs, but requires a much smaller circuit area compared to the "Hershey's Kiss" spread spectrum oscillator 300 of FIG. 3.

Note that steps 710 and 720 correspond to the +2 phase and are encountered twice during the frequency modulation cycle, like all other intermediate steps. However the largest step 730 and the smallest step 750 occur only once during the frequency modulation cycle, causing a slight distortion in the EMI spectrum. Accordingly in one embodiment, digital modulator 400 could be modified slightly to repeat the count values for the largest step 730 (corresponding to the +7 phase) and the smallest step 750 (corresponding to the −7 phase).

Figure 8:
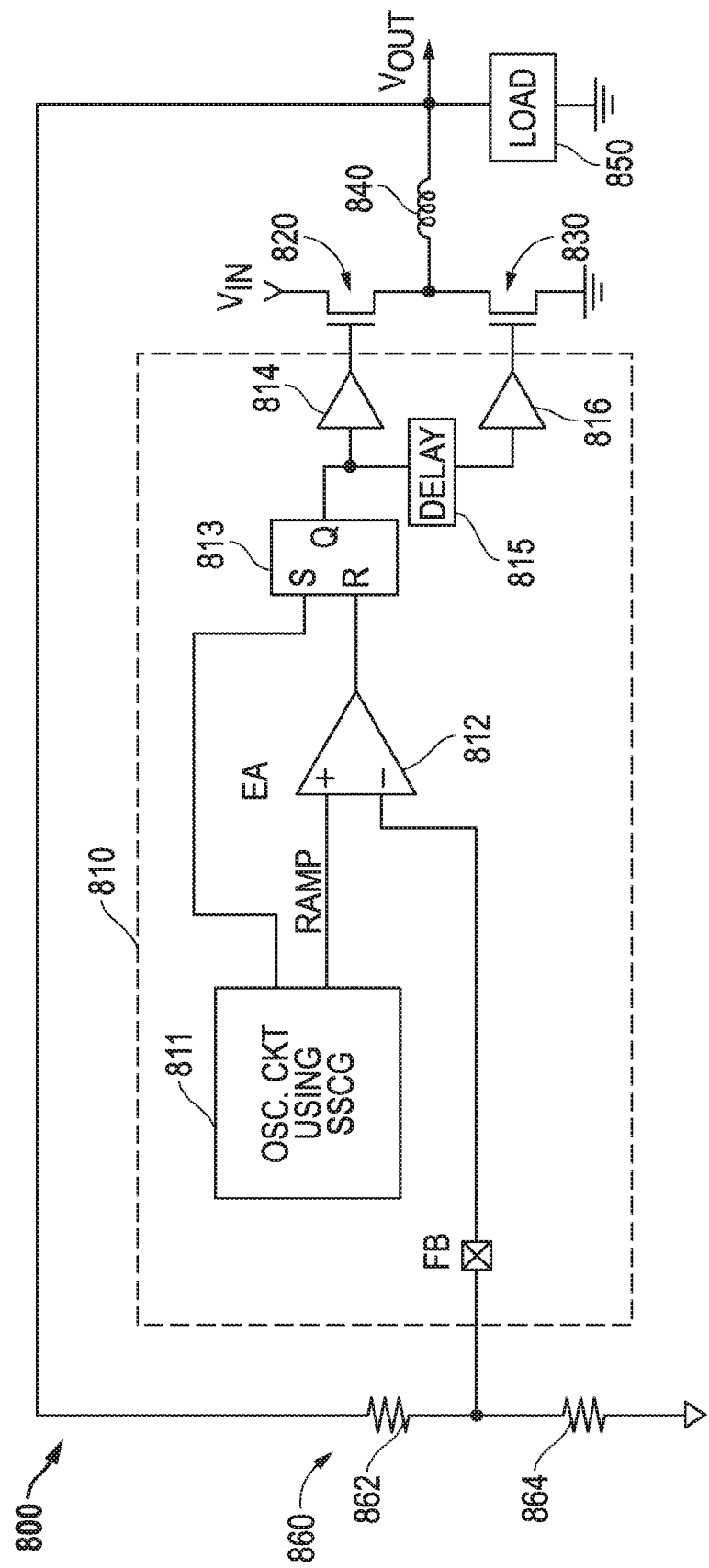
FIG. 8 illustrated in partial block diagram and partial schematic form a direct current (DC)-DC converter using the spread spectrum clock generator of FIG. 4.

FIG. 8 illustrated in partial block diagram and partial schematic form a DC-DC converter 800 using a spread spectrum clock generator such as spread spectrum clock generator 400 of FIG. 4. DC-DC converter 800 includes generally a controller chip 810, a high side switch 820, a low side switch 830, an inductor 840, a load 850, and a feedback circuit 860. Controller chip 810 includes a pulse width modulator (PWM) switching regulator as well as a variety of other circuits useful in DC-DC power supplies that are not shown in FIG. 8. Controller chip 810 includes an oscillator circuit 811 using a spread spectrum clock generator, an error amplifier 812, a PWM latch 813, a high side driver 814, a delay element 815, and a low-side driver 816. Oscillator circuit 811 has two outputs including a first output for providing a square wave clock signal, and a second output for providing a ramp signal. Error amplifier 812 has a non-inverting input connected to the first output of oscillator 811, an inverting input connected to a feedback terminal labeled "FB", and an output. PWM latch 813 has a set (S) input connected to the first output of oscillator circuit 811, a reset (R) input connected to the output of error amplifier 812, and an output (Q). Driver 814 is a non-inverting driver that has an input connected to the Q output of PWM latch 813, and an output. Delay element 815 has an input connected to the Q output of PWM latch 813, and an output. Driver 815 is an inverting driver that has an input connected to the output of delay element 815, and an output.

Transistor 820 has a drain for receiving an input voltage labeled "VIN", a gate connected to the output of driver 814, and a source. Transistor 830 has a drain connected to the source of transistor 820, a gate connected to the output of driver 816, and a source connected to ground. Inductor 840 has a first terminal connected to the source of transistor 820 and the drain of transistor 830, and a second terminal for providing an output voltage labeled "VOUT". Load 850 has a first terminal connected to the second terminal of inductor 840, and a second terminal connected to ground. Feedback circuit 860 includes resistors 862 and 864. Resistor 862 has a first terminal for receiving VOUT, and a second terminal connected to the FB terminal of controller chip 810. Resistor 864 has a first terminal connected to the second terminal of resistor 862, and a second terminal connected to ground.

In operation, controller chip 810 changes the duty cycle of the high side driver and the low side driver in response to a difference between the ramp signal provided by oscillator 811 and the voltage on the FB pin. The voltage on the FB pin in turn is a voltage proportional to VOUT as determined by the values of resistors 862 and 864. High side switch 820 and low side switch 830 are on the input side of inductor 840, and thus DC-DC converter 800 operates as a buck converter. Controller chip 810 uses an oscillator based on a spread spectrum clock generator as described herein such as spread spectrum clock generator 400 of FIG. 4. Thus controller chip 810 is compact and inexpensive to the user.

The above-disclosed subject matter is to be considered illustrative, and not restrictive, and the appended claims are intended to cover all such modifications, enhancements, and other embodiments that fall within the true scope of the claims. For example the spread spectrum clock generator can be used in a variety of electronic products such as microcontrollers, switch mode power supplies, and the like. Moreover the triangular wave signal could be replaced with a similar signal having a uniform amplitude over a period, such as an asymmetric triangular wave or a sawtooth wave. While the relaxation oscillator disclosed herein is compact, it could be replaced by other oscillator designs. Based on the requirements of the application, the discrete triangle wave of FIG. 7 could be used, or the waveform could be modified to improve EMI spreading by correcting the small distortion at the extreme high and low frequencies.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A spread spectrum clock generator comprising:
an oscillator having a control input for setting an output frequency, and an output for providing a clock output signal; and
a digital modulator responsive to said clock output signal to provide a control code to said control input of said oscillator as a periodic signal with a plurality of discrete steps, wherein said digital modulator provides said control code at each of said plurality of discrete steps for substantially a predetermined time.

2. The spread spectrum clock generator of claim 1, wherein said oscillator comprises an analog oscillator.

3. The spread spectrum clock generator of claim 2, wherein said analog oscillator comprises a relaxation oscillator whose oscillator frequency is determined by a capacitance and a charging current, wherein said relaxation oscillator changes said oscillation frequency by varying said charging current in response to said control code.

4. The spread spectrum clock generator of claim 1, wherein said periodic signal comprises a triangle wave over a predetermined period.

5. The spread spectrum clock generator of claim 4, wherein said triangle wave includes a discrete step corresponding to a maximum value of said triangle wave and a discrete step corresponding to a minimum value of the triangle wave, and said digital modulator repeats said discrete step corresponding to a maximum value and said discrete step corresponding to a minimum value such that said output frequency corresponds to said discrete step corresponding to said maximum value and said discrete step corresponding to said minimum value substantially for said predetermined time over said predetermined period.

6. The spread spectrum clock generator of claim 1, wherein said digital modulator further has a trim input for receiving an oscillator trim signal, and offsets said control code at each of said plurality of discrete steps in response to said oscillator trim signal.

7. The spread spectrum clock generator of claim 1, wherein said digital modulator dithers between adjacent pairs of said plurality of discrete steps.

8. The spread spectrum clock generator of claim 1, wherein said digital modulator comprises:
   a fixed time counter having a clock input for receiving said clock output signal, a control input for receiving a timeout value, and an output for providing a timeout signal after said fixed time counter counts said predetermined time using said timeout value;
   a counter phase circuit having an input coupled to said output of said fixed time counter, and an output for providing a counter phase value, wherein said counter phase circuit continuously changes said counter phase value from a middle state to a largest state to a smallest state to said middle state in response to activations of said timeout signal; and
   a code generator circuit having an input coupled to said output of said counter phase circuit, a first output for providing said timeout value, and a second output for providing said control code in response to said counter phase value, wherein said timeout value represents a number of cycles of said clock output signal corresponding to said predetermined time, and said control code corresponds to frequencies of said oscillator such that said output frequency changes substantially evenly from a middle frequency to a largest frequency to a smallest frequency to said middle frequency over said predetermined time.

9. The spread spectrum clock generator of claim 8, wherein said code generator circuit comprises a lookup table.

10. The spread spectrum clock generator of claim 8, wherein said code generator circuit comprises a digital finite state machine.

11. The spread spectrum clock generator of claim 8, wherein counter phase circuit further has a control input for receiving an oscillator trim signal, wherein said counter phase circuit uses said oscillator trim signal to vary a number of states it cycles through to keep a modulation depth of spread spectrum clock generator substantially fixed.

12. A switch mode power supply, comprising:
   an oscillator circuit using a spread spectrum clock generator, said oscillator circuit generating a ramp signal;
   an error amplifier having first input for receiving said ramp signal, a second input for receiving a feedback signal, and an output;
   a pulse width modulator latch having an input coupled to said output of said error amplifier, and forming a pulse width modulator output signal in response to a duty cycle defined by said output of said pulse width modulator latch; and
   a driver circuit for providing at least one output signal to control the switching of an energy transfer element,
   wherein said spread spectrum clock generator comprises:
      an oscillator having a control input for setting an output frequency, and an output for providing a clock output signal; and
      a digital modulator responsive to said clock output signal to provide a control code to said control input of said oscillator as a periodic signal with a plurality of discrete steps, wherein said digital modulator provides said control code at each of said plurality of discrete steps for substantially a predetermined time.

13. The switch mode power supply of claim 12, wherein said oscillator circuit, said an error amplifier, said pulse width modulator latch, and said driver circuit are combined on a single integrated circuit chip.

14. The switch mode power supply of claim 12, wherein said energy transfer element comprises an inductor and the switch mode power supply uses the inductor to operate as a DC-DC converter.

15. The switch mode power supply of claim 12, wherein said oscillator comprises an analog oscillator.

16. The switch mode power supply of claim 15, wherein said analog oscillator comprises a relaxation oscillator whose oscillator frequency is determined by a capacitance and a charging current, wherein said relaxation oscillator changes said oscillation frequency by varying said charging current in response to said control code.

17. The switch mode power supply of claim 12, wherein said periodic signal comprises a triangle wave over a predetermined period.

18. The switch mode power supply of claim 17, wherein said triangle wave includes a discrete step corresponding to a maximum value of said triangle wave and a discrete step corresponding to a minimum value of said triangle wave, and said digital modulator repeats said discrete step corresponding to said maximum value and said discrete step corresponding to said minimum value such that said output frequency corresponds to said discrete step corresponding to said maximum value and said discrete step corresponding to said minimum value substantially for said predetermined time over said predetermined period.

19. The switch mode power supply of claim 12, wherein said digital modulator further has a trim input for receiving an oscillator trim signal, and offsets said control code at each of said plurality of discrete steps in response to said oscillator trim signal.

20. The switch mode power supply of claim 12, wherein said digital modulator dithers between adjacent pairs of said plurality of discrete steps.

21. The switch mode power supply of claim 12, wherein said digital modulator comprises:
   a fixed time counter having a clock input for receiving said clock output signal, a control input for receiving a timeout value, and an output for providing a timeout signal after said fixed time counter counts said predetermined time using said timeout value;
   a counter phase circuit having an input coupled to said output of said fixed time counter, and an output for providing a counter phase value, wherein said counter phase circuit continuously changes said counter phase value from a middle state to a largest state to a smallest state to said middle state in response to activations of said timeout signal; and
   a code generator circuit having an input coupled to said output of said counter phase circuit, a first output for providing said timeout value, and a second output for providing said control code in response to said counter phase value, wherein said timeout value represents a number of cycles of said clock output signal corresponding to said predetermined time, and said control code corresponds to frequencies of said oscillator such that said output frequency changes substantially evenly from a middle frequency to a largest frequency to a smallest frequency to said middle frequency over said predetermined time.

22. A method for generating a spread spectrum clock signal comprising:
   providing an output clock signal at an output frequency;
   varying said output frequency in response to a control signal;
   providing a control code as a periodic signal responsive to said clock output signal with a plurality of discrete steps wherein each step lasts for substantially a predetermined time; and
   providing said control code as said control signal.

23. The method of claim 22, wherein said providing said output clock signal comprises providing said output clock signal using a relaxation oscillator.

24. The method of claim 23, wherein said varying said output frequency in response to said control signal comprises varying a charging current of a capacitor of said relaxation oscillator in response to said control code.

25. The method of claim 22, wherein said providing said control code as said periodic signal comprises providing said control code to approximate a triangle wave over a predetermined period.

26. The method of claim 25, wherein said providing said control code to approximate said triangle wave over said predetermined period comprises providing said control code having a maximum value and a minimum value, and repeating said maximum value and said minimum value such that said output frequency corresponds to said maximum value and said minimum value substantially said predetermined time over said predetermined period.

27. The method of claim 22, further comprising offsetting said control code at each of said plurality of discrete steps in response to an oscillator trim signal.

28. The method of claim 22, further comprising dithering between adjacent pairs of said plurality of discrete steps.

* * * * *